US011665985B2

(12) United States Patent
Kersting et al.

(10) Patent No.: US 11,665,985 B2
(45) Date of Patent: May 30, 2023

(54) PROJECTED MEMORY DEVICE WITH REDUCED MINIMUM CONDUCTANCE STATE

(71) Applicant: INTERNATIONAL BUSINESS MACHINES CORPORATION, Armonk, NY (US)

(72) Inventors: Benedikt Kersting, Zurich (CH); Ghazi Sarwat Syed, Zurich (CH); Vara Sudananda Prasad Jonnalagadda, Wallisellen (CH); Manuel Le Gallo-Bourdeau, Zurich (CH); Abu Sebastian, Adliswil (CH); Timothy Mathew Philip, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 142 days.

(21) Appl. No.: 16/949,988

(22) Filed: Nov. 23, 2020

(65) Prior Publication Data
US 2022/0165948 A1    May 26, 2022

(51) Int. Cl.
*H10N 70/20* (2023.01)
(52) U.S. Cl.
CPC ........... *H10N 70/841* (2023.02); *H10B 63/00* (2023.02); *H10N 70/231* (2023.02); *H10N 70/8845* (2023.02)
(58) Field of Classification Search
CPC ........ H01L 27/24; H01L 45/06; H10N 70/231
See application file for complete search history.

(56) References Cited

U.S. PATENT DOCUMENTS 10,290,804 B2    5/2019  Ruiz
2014/0369113 A1* 12/2014 Krebs ................. H10N 70/011
                                                        365/163

FOREIGN PATENT DOCUMENTS

GB    2515100 A    12/2014
GB    2515101    * 12/2014    ............. H01L 45/00

OTHER PUBLICATIONS

Combined Search and Examination Report under Sections 17 and 18(3), dated Apr. 22, 2022, Application No. GB2116055.1, 7 pages.
(Continued)

*Primary Examiner* — Moazzam Hossain
*Assistant Examiner* — Hajar Kolahdouzan
(74) *Attorney, Agent, or Firm* — Samuel A. Waldbaum

(57) ABSTRACT

A memory device enabling a reduced minimal conductance state may be provided. The device comprises a first electrode, a second electrode and phase-change material between the first electrode and the second electrode, wherein the phase-change material enables a plurality of conductivity states depending on the ratio between a crystalline and an amorphous phase of the phase-change material. The memory device comprises additionally a projection layer portion in a region between the first electrode and the second electrode. Thereby, an area directly covered by the phase-change material in the amorphous phase in a reset state of the memory device is larger than an area of the projection layer portion oriented to the phase-change material, such that a discontinuity in the conductance states of the memory device is created and a reduced minimal conductance state of the memory device in a reset state is enabled.

12 Claims, 7 Drawing Sheets

(56) References Cited

OTHER PUBLICATIONS

Giannopoulos, et al., "8-bit Precision In-Memory Multiplication with Projected Phase-Change Memory," 2018 IEEE International Electron Devices Meeting (IEDM), Dec. 1-5, 2018 [accessed on Sep. 22, 2020], pp. 27.1.1-27.7.4, IEEE, San Francisco, CA, US, DOI: 10.1109/IEDM.2018.8614558, Retrieved from the Internet: <URL: https://ieeexplore.ieee.org/document/8614558>.

Koelmans, et al., "Projected phase-change memory devices," Nature Communications, 2015, 7 pages, Macmillan Publishers Limited, DOI: 10.1038/ncomms9181, Retrieved from the Internet: <URL: https://www.nature.com/articles/ncomms9181>.

Le Gallo, et al., "An overview of phase-change memory device physics," Journal of Physics D: Applied Physics, Mar. 2020, 28 pages, vol. 53, No. 21, IOP Publishing Ltd, UK, DOI: 10.1088/1361-6463/ab7794, Retrieved from the Internet: <URL: https://iopscience.iop.org/article/10.1088/1361-6463/ab7794/pdf>.

Sebastian, et al., "Computational phase-change memory: beyond von Neumann computing," Journal of Physics D: Applied Physics, Aug. 2019 [accessed on Jun. 5, 2020], 14 pages, vol. 52, No. 44, IOP Publishing Ltd, UK, DOI: 10.1088/1361-6463/ab37b6, Retrieved from the Internet: <URL: 10.1088/1361-6463/ab37b6>.

Examination Report under Section 18(3), Application No. GB2116055.1, dated Jan. 9, 2023, 5 pages.

Intellectual Property Office, Patents Act 1977: Examination Report under Section 18(3), Application No. GB2116055.1, dated Mar. 9, 2023, 4 pages.

* cited by examiner

PROJECTED MEMORY DEVICE WITH REDUCED MINIMUM CONDUCTANCE STATE

BACKGROUND

The invention relates generally to a phase-change memory, and more specifically, to a memory device enabling a reduced minimal conductance state.

University and industry research are constantly investigating new materials and methods to increase storage density in semiconductor devices and at the same time reduce power consumption per stored information. In this context, resistive memory devices, such as phase-change memories and conductive bridge memristors, which can be switched reversely between a multitude of conductance states are becoming increasingly popular for multi-level data storage as well as for in-memory and neuromorphic computing hardware.

There are a few key challenges to the realization of multi-levels, efficiency, drift and noise. The cell efficiency aspect addresses the ability to program and read the devices at various levels with very low current/power consumption. The drift and noise aspect addresses drift and noise effects due to intrinsic material physics that negatively effects the resistance read-out.

These challenges have recently been addressed with a new memory cell concept denoted the projected phase-change memory in which the phase-change material is adhered to an electrical conductive material, called the projection component. In the projected memory cell, the physical mechanism of resistance storage is basically decoupled from the information retrieval process. The read current can bypass the amorphized phase-change material, whereby it flows through the not drifting, less noisy and higher conductive projection material.

Even though reduced drift and read noise are highly beneficial, the device concept also has a drawback. The minimum conductance of the device may be increased substantially. The device dynamic range may be decreased and idle devices (G-0) may pass more current during readout. Thus, the array energy efficiency may decrease during readout and the network functionality can be impaired if devices cannot be programmed to a proper OFF state (G=0).

BRIEF SUMMARY

Additional aspects and/or advantages will be set forth in part in the description which follows and, in part, will be apparent from the description, or may be learned by practice of the invention.

According to one aspect of the present invention, a memory device enabling a reduced minimal conductance state may be provided. The device may comprise a first electrode, a second electrode and phase-change material between the first electrode and the second electrode. Thereby, the phase-change material may enable a plurality of conductivity states depending on the ratio between a crystalline and an amorphous phase of the phase-change material.

The memory device may also comprise a projection layer portion in a region between the first electrode and the second electrode. Thereby, an area that is directly covered by the phase-change material in the amorphous phase in a reset state of the memory device may be larger than an area of the projection layer portion oriented to the phase-change material. This way, a discontinuity in the conductance states of the memory device may be created and a reduced minimal conductance state of the memory device in a reset state may be enabled.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
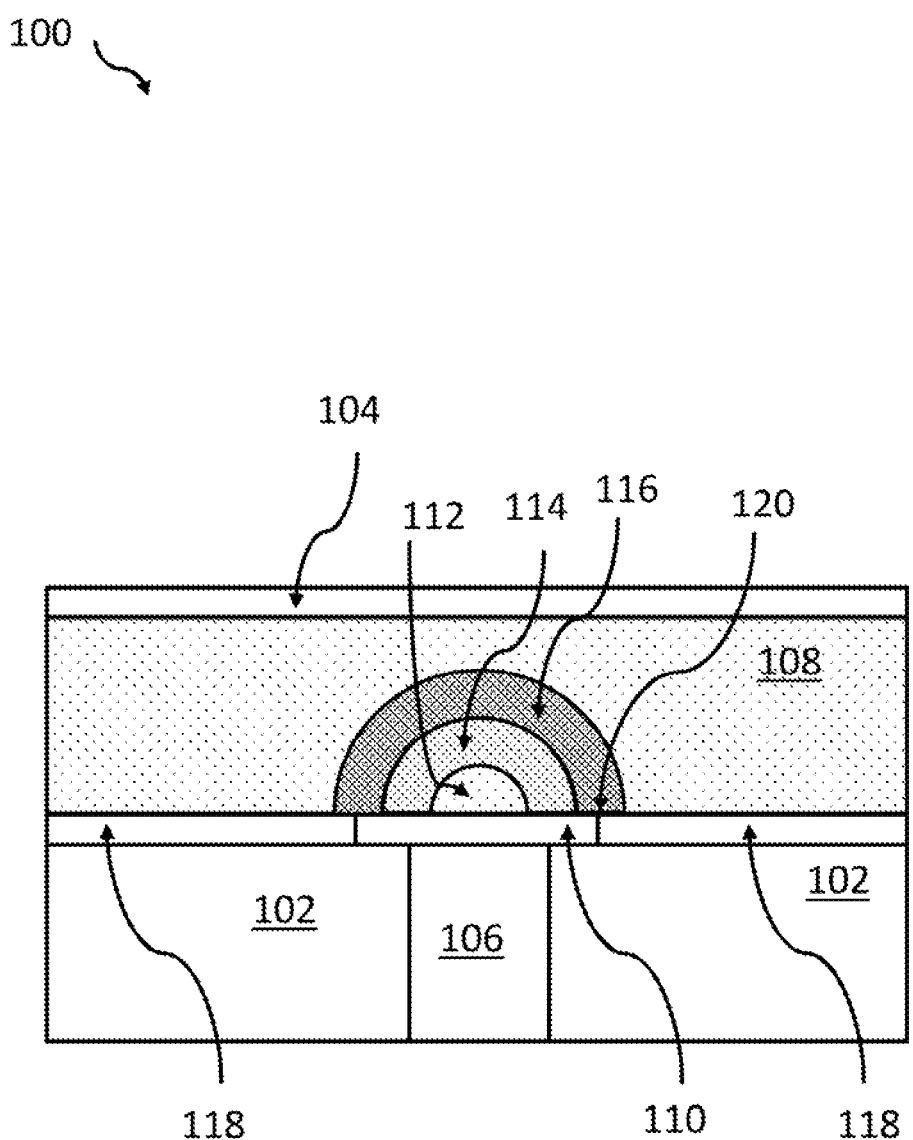
FIG. 1 shows a block diagram of an embodiment of the inventive memory device enabling a reduced minimal conductance state.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

In the context of this description, the following conventions, terms and/or expressions may be used.

The term 'memory device' may denote here, in particular, a memory cell for storing one or more bits based on phase-change material. A phase-change memory (PCM) is known as a type of non-volatile random-access memory. It is often based on the unique behavior of chalcogenide glass. However, also other materials have been used successfully. The effect is based on the change in conductivity between the crystalline and the amorphous phase of the PCM. The phase-change may be induced by heat, e.g., by current flowing through the device. PCMs may also be denoted as memristors. They may not only be used as memory elements but also as a basis for active computing devices.

The term 'minimal conductance state' may denote the reset state of a PCM cell. If all or most of the PCM material in the PCM cell is in the amorphous phase, the resistance is increased to the highest value possible for the PCM. This state may represent the state with a minimum conductance for the respective PCM cell.

The term 'projection layer portion' or in another words 'liner' may denote a more or less conductive material which is positioned parallel to the phase-change material of a PCM cell and which may be in particular in one embodiment, i.e. the mushroom version in contact with one of two electrodes of the cell. In case of other embodiments in particular the lateral and the confined version the projection layer portion is not in contact with any of the electrodes. The projection layer portion may also be denoted as a confined liner or a confined projection not spanning over the complete length of a volume of the phase-change memory.

In a projected memory cell, a projection layer may be instrumental to decouple the physical mechanism of resistance storage from the information retrieval process. The read current bypasses the amorphous phase-change material and flows through the non-drifting, less noisy and more highly conductive projection material. In contrast to the here proposed new concept of a confined projection or liner, the traditional projected memory cell has also a drawback. The minimum conductance of the device may be increased substantially. The device dynamic range is therefore decreased and reset devices (G about 0) may pass more current during a read-out. Thus, memory cell power efficiency during read-out may decrease because the cell cannot be programmed to a proper OFF state (G=0).

The projection layer portion, which may only cover a portion of the phase-change material in a reset state, may therefore also be denoted as 'confined projection' within a potentially larger or very low conductive layer portion, i.e., the non-projecting portion. Hence, the projection layer portion, together with the non-projecting portion, may build the projection layer.

The term 'non-projecting portion' may denote a portion of a projection layer of a phase-change memory cell having a much lower conductivity than the confined projection portion or liner.

The term 'reset state' may denote a state of a phase-change memory cell in which the conductivity may be as low as possible, i.e., as much of the phase-change material may be in the amorphous phase.

The term 'discontinuity in the conductance states' may denote that the conductance states of the phase-change memory cell. Instead, at a certain point if the phase-change material in the amorphous phase covers a larger area than the maximum area of the liner or projection layer portion a stepwise increase/decrease (depending on the perspective) can be observed in the current versus voltage line.

The proposed memory device enabling a reduced minimal conductance state may offer multiple advantages, contributions and technical effects:

A substantially lower drift and conductance fluctuations arising from 1/f for the memory cell or memory device (f=frequency). This is a consequence of the fact that the majority of the read current bypasses the amorphous volume in a reset state of the memory cell.

This effect may advantageously be used in cross-bar arrays of memristive cells because the absolute noise level of statuses of reset cells is relevant for device applications, e.g., in the neuromorphic computing, training and inference of classical deep neural networks based on phase-change memory. These applications may benefit from a low conductance ($G_{MIN}$) device state for several reasons. Many weights in deep neural networks are small or close to zero. To encode such weights, a low $G_{MIN}$ may be necessary.

When $G_{MIN}$ is too high, two devices in differential configurations must be programmed to the same conductance to represent zero. It may be very challenging to program two devices to exactly the same conductance, and therefore this method will lead to prohibitive noise on the zero weights which is completely avoided if one can program the device to a low enough $G_{MIN}$.

Additionally, if small or close to zero weights may be encoded by the $G_{MIN}$ (reset) device state, the power consumption of the related deep neural network may be reduced substantially because $G_{MIN}$ is decreased by at least one order of magnitude.

The improvements over traditional approaches also include: by confining the projection layer or liner to an area smaller than the active volume (the largest amorphous volume created upon resetting the device), projection is enabled in the intermediate conductance range which may be relevant for multi-level programming of the memory device. However, it is disabled for the low conductance state $G_{MIN}$. Thereby, drift mitigation may be enabled for intermediate and high conductance states. Hence, the substantially reduced $G_{MIN}$ may enable a higher dynamic range so that drift and noise of $G_{MIN}$ may become irrelevant in the discussed (and other) applications of the memory device.

This way, the advantages of projected phase-change memory cells may be realized but the disadvantages may also be avoided successfully.

According to one advantageous embodiment of the memory device, the projection layer portion may cover one of the first and the second electrode. Such a design may typically be denoted as 'mushroom cell type'. The reason is that typically, a lower electrode is passed through a dielectric and the liner or projection layer portion may be positioned on top of the lower electrode, i.e., the bottom electrode. The amorphous phase-change material may expand over the liner in half-sphere form making it look like (together with the lower electrode) a mushroom.

According to an embodiment of the memory device, the first electrode and the second electrode may both be in contact with a dielectric layer in an area in which the first electrode and the second electrode are not in contact with the phase-change material, the projection layer portion may extend laterally over the dielectric layer, and a surface of the projection layer portion opposite to the surface of the projection layer not facing the dielectric material may be in contact with the phase-change material. Such a phase-change memory cell design may be denoted as 'lateral cell design'.

According to an embodiment of the memory device, the dielectric layer portion may surround (in particular only partially and not from the top to the bottom electrode) the phase-change material. This cell design may be defined as 'confined' phase-change memory cell design. The phase-change material may be positioned in the middle and it may be partially surrounded by the projection layer portion which is then completely wrapped by a dielectric material. The first and the second electrode, which may be implemented as a top and bottom electrode, may be in contact with a phase-change material. Consequently, and according to a refined embodiment of the memory device, the projection layer portion may be positioned around the phase-change material and the projection layer portion may be surrounded by the dielectric material.

According to a preferred embodiment of the memory device, the projection layer portion may comprise $Ti_xN_y$, $Ta_xN_y$, or amorphous carbon. These materials may advantageously be used as liner material because of its clearly definable conductivity depending on a doping level.

According to an additional embodiment of the memory device, the projection layer portion may be extended by a non-projecting portion, having a (significantly) lower conductivity than the projection layer portion. Both, the projection layer portion and the non-projecting portion, may build one projection layer with a higher conductive area (i.e., the projecting layer portion) and a less or nonconductive area, the non-projecting layer portion(s). Both portions may be positioned on a dielectric material. The different conductivity characteristics may be achieved by different doping processes of the different portions of the projection layer. Alternatively, the non-projecting portions of the projection layer may be omitted completely.

According to a preferred embodiment of the memory device, the following condition may be fulfilled:

$$R_{NON-PROJECTING} \gg R_{AMORPHOUS} \gg R_{PROJECTION},$$

wherein $R_{NON-PROJECTING}$=a resistance of the non-projecting portion, $R_{AMORPHOUS}$=a resistance of the phase-change material if an area covered by the crystalline phase of the phase-change material may be covering the complete projection layer portion, and $R_{PROJECTION}$=a resistance of the projection layer portion. Hence, if the volume of the phase-change material may have been grown large enough, i.e., covering the complete liner, a discontinuity in the current versus voltage curve may happen because the current may no longer bypass the amorphous portion of the phase-change material via the liner.

According to an embodiment of the memory, the projection layer portion and the non-projecting layer portion may be differently doped. The doping concentration of material may depend whether the conductivity should be increased or decreased. Exemplary, $H_2$ or $N_2$ may be used as doping material.

According to an embodiment of the memory device, the doping of the non-projecting layer portion and the projection layer portion may be such that a device current (when the phase-change material in the amorphous phase) may cover the complete projection layer portion, may be lower by at least a factor of 2 if compared to a status in which the complete projection liner portion (i.e., the liner) may be covered by the phase-change material in the amorphous phase. This may also be seen as a consequence of the relationships of the resistance of the different materials, i.e., the non-projecting portion, the projecting portion and the phase-change material in the amorphous phase.

According to an embodiment of the memory device, the doping between the projection layer portion and the non-projecting layer of the projection layer may change according to a predefined gradient. Thus, more advanced dependencies between the current through the projection layer and the phase-change material in the amorphous phase may be created.

According to an embodiment of the memory device, the projection layer portion and/or the non-projecting layer portion may be hydrogen or nitrogen doped. These materials have been proven to be of practical use for these kinds of memory cells and the confined projection layer design. They may increase or decrease the conductivity of the respective layer material. Known mask processes may be used to control the doping process.

According to an embodiment of the memory device, a dopant concentration increasing the conductivity may be higher in the projection layer portion (i.e., the liner) if compared to the non-projecting layer portion. This is a logical consequence of the design principle used here. The projection layer portion shall enable an easy flow of the current through this portion of the device. The contrast is true for the non-projecting portion.

According to an embodiment of the memory device, a dopant concentration decreasing the conductivity may be higher in the non-projecting portion if compared to the projection portion. Again, this may be a logical consequence of the proposed cell design.

According to an embodiment of the memory device, $R_{CRYST} \ll R_{PROJECTION}$ during a read operation to the memory device, wherein $R_{CRYST}$ is the resistance of the phase-change material in the crystalline phase, and $R_{PROJECTION}$ is the resistance of the projection layer portion. Hence, the majority of the current through the cell may flow through the phase-change material in the crystalline phase instead of flowing through the projection layer portion.

According to a further embodiment of the memory device, $R_{AMORPHOUS} \gg R_{PROJECTION}$. This relationship may be instrumental for a proper functioning of read operations.

In the following, a detailed description of the figures will be given. All instructions in the figures are schematic. In particular, a block diagram of an embodiment of the inventive memory device enabling a reduced minimal conductance state is given.

FIG. 1 shows a block diagram of an embodiment of the inventive memory device 100 enabling a reduced minimal conductance state. The memory device 100 (here in the form of a single cell) shows a patterned liner layer 110, 118 on top of a dielectric material 102. The bottom electrode 106 is in contact with a middle part of the liner, i.e., the projection layer portion 110. Atop the projection layer portion 110 phase-change material in a crystalline status 108 and in an amorphous status 112, 114, 116 is shown. Atop of the phase-change material 108 a top electrode 104 is present.

A reduced $G_{MIN}$ status can be created by patterning the projection layer 110, 118 into a projection layer portion 110 and non-projecting layer portions 118. The letter G denotes the conductivity (1/resistance). The liner 110 in the center of the active device volume has a low resistivity to enable projection (in particular in non-reset states) such that less than, e.g., about 10% of the readout current should parse the amorphous volume 112, 114, 116.

Thereby, the size of the low resistive liner is limited to an area smaller than the maximum size of the amorphous dome for the shown mushroom type cell design. This is indicated shown by the border line 120 between the projection layer portion 110 and the non-projecting layer portions 118. As a consequence of the confined liner or projection layer portion 110, the device programming curve shows a discontinuity once a critical size of the amorphous volume is created, i.e., once the area of the amorphous portion of the phase-change material in contact with the projection is larger than the low resistance projection layer portion 110. This is shown in FIG. 2.

Figure 2:
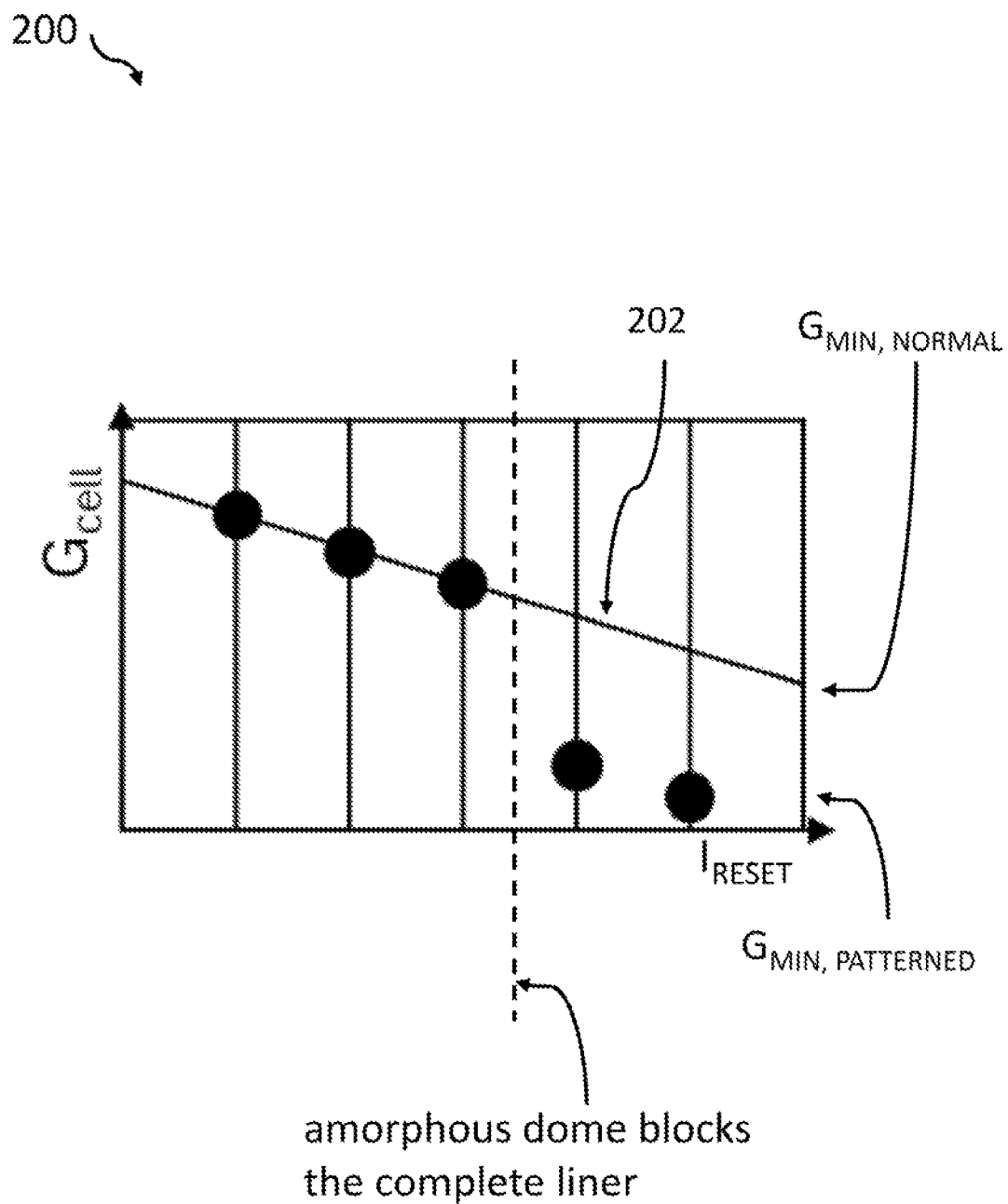
FIG. 2 shows a conductivity diagram for a traditional projection liner in comparison to the patterned projection, as proposed here.

FIG. 2 shows a conductivity diagram 200 for a traditional projection liner in comparison to the patterned projection, as proposed here. Line 202 shows the conductivity $G_{CELL}$ of the cell in comparison to the write current I for different statuses of the cell. Once the volume of the amorphous portion of the phase-change material grows larger than the horizontal extension of the projection layer portion 110 (i.e., if the amorphous dome blocks the complete projection layer portion 110) the cell conductivity drops significantly (the two conductivity statuses on the right side of the dashed line, indicated as black filled circles). Hence, the reset conductance is significantly smaller than in traditional projected memory cells.

Figure 3A:
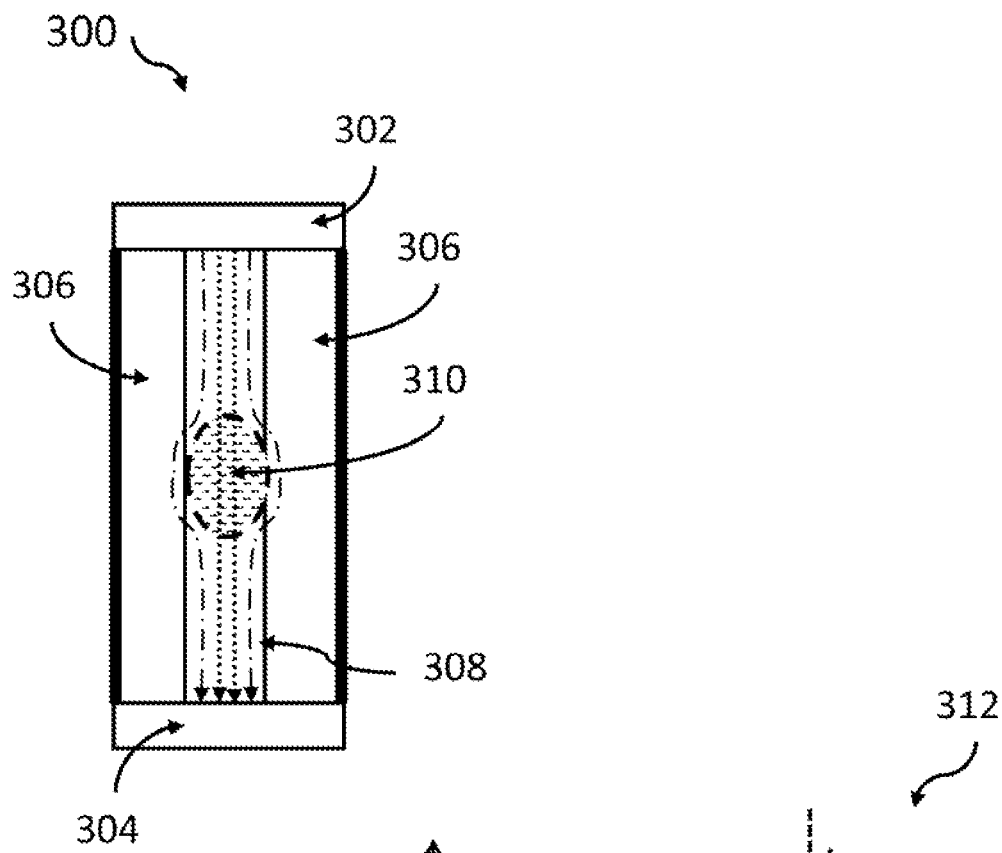
FIG. 3A shows a design of a projected memory device.

FIG. 3A shows again as background a typical design of a traditionally projected memory device 300. It comprises a top electrode 302 and a bottom electrode 304. In between, surrounding the phase-change material 308, a projection layer 306 is shown.

Figure 3B:
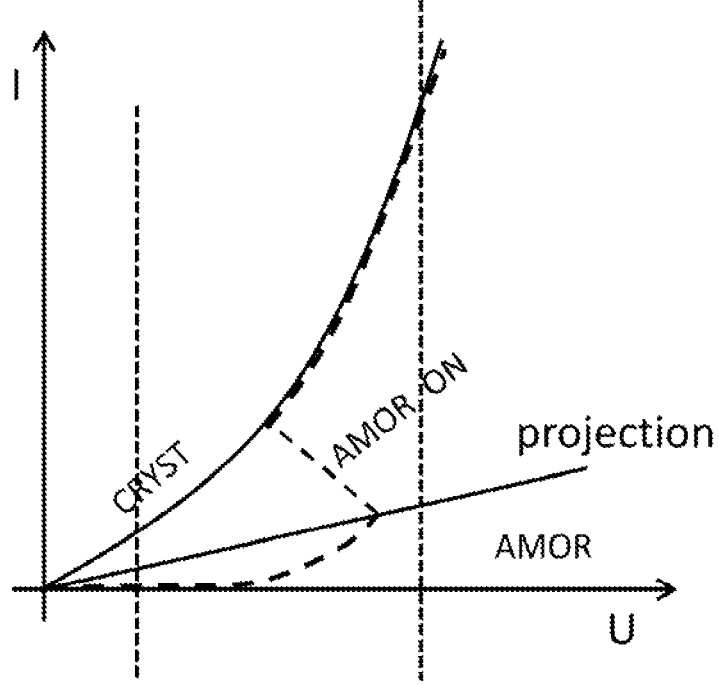
FIG. 3B is a chart showing the current I dependent on the voltage supplied to the phase-change memory cell.

During a write process, the current (symbolized by the dotted straight lines from the top electrode 302 to the bottom electrode 304 passes through the phase-change material 308 in crystalline form building the amorphous phase 310 somewhere in the middle between the top and the bottom electrode. The chart in FIG. 3B shows the resistance $R_{CRYST}$ is thereby much smaller than the resistance $R_{PROJECTION}$ of the projection layer portion, i.e., $R_{CRYST} \ll R_{PROJECTION}$. During the read process, the current from the top electrode 302 to the bottom electrode 304 (symbolized by the second dashed line) may surround the amorphous portion 310 of the phase-change material 308 because $R_{AMORPHOUS} \gg R_{PROJECTION}$.

Through this concept of projection, the physical mechanism of resistance storage is decoupled from the information retrieval process, i.e. read-out. It exploits the unique electrical transport and structural dynamics in the memory material, i.e., the phase-change material.

This is again shown by the chart 312 showing the current I dependent on the voltage supplied to the phase-change memory cell. The projection layer shows a constant resistance (flat line). At a certain point of the resistance of the amorphous phase (AMOR) there is a jump-point in the cell resistance. The portion of the curve, indicated as "AMOR ON", is the point in which the phase-change material changes at least partially to the crystalline phase, thereby decreasing the resistance, i.e., increasing the conductance.

Figure 4:
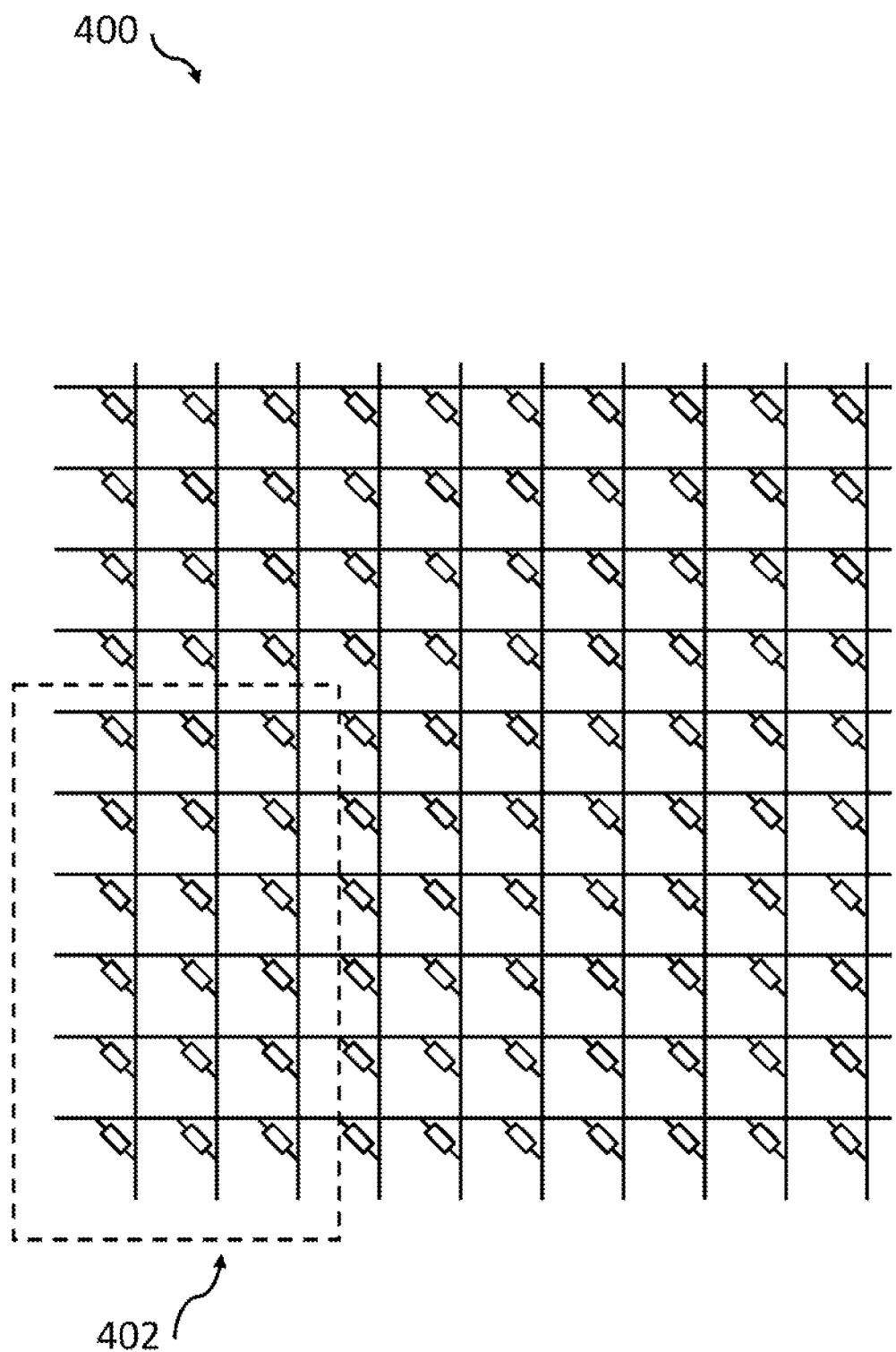
FIG. 4 shows a crossbar of neural network cells which may be used as a basis for programming the weighing values.

FIG. 4 shows a crossbar array 400 of neural network cells which may be used as a basis for programming the weighing values for a, e.g., deep neural network (DNN). The above discussed effect can be especially advantageous when mapping a deep neural network structure to a crossbar array 400 of phase-change memory cells. Often, only a smaller portion 402 of larger crossbar array 400 of phase-change memory cells may be used in a practical implementation. Hence, many more phase-change memory cells are available in such a device than actually required and used. For these non-used phase-change memory cells, it would be best if their conductivity in a reset state (i.e., large amorphous volume) would only show a very small conductivity, in an ideal case, being equal to zero.

This will clearly minimize the power consumption of the array during read-out and thus, the network efficiency would be increased. This is because most weights in a deep neural network which may be encoded by the phase-change memory cells of the array are typically zero, or at least close to zero. The improved $G_{MIN}$ status allows mapping these weights directly to a device status without any additional electronic components. A different device configuration is therefore not needed. Because the network efficiency is improved, also the deep neural network efficiency can be improved significantly, which is especially relevant for inference applications.

Figure 5:
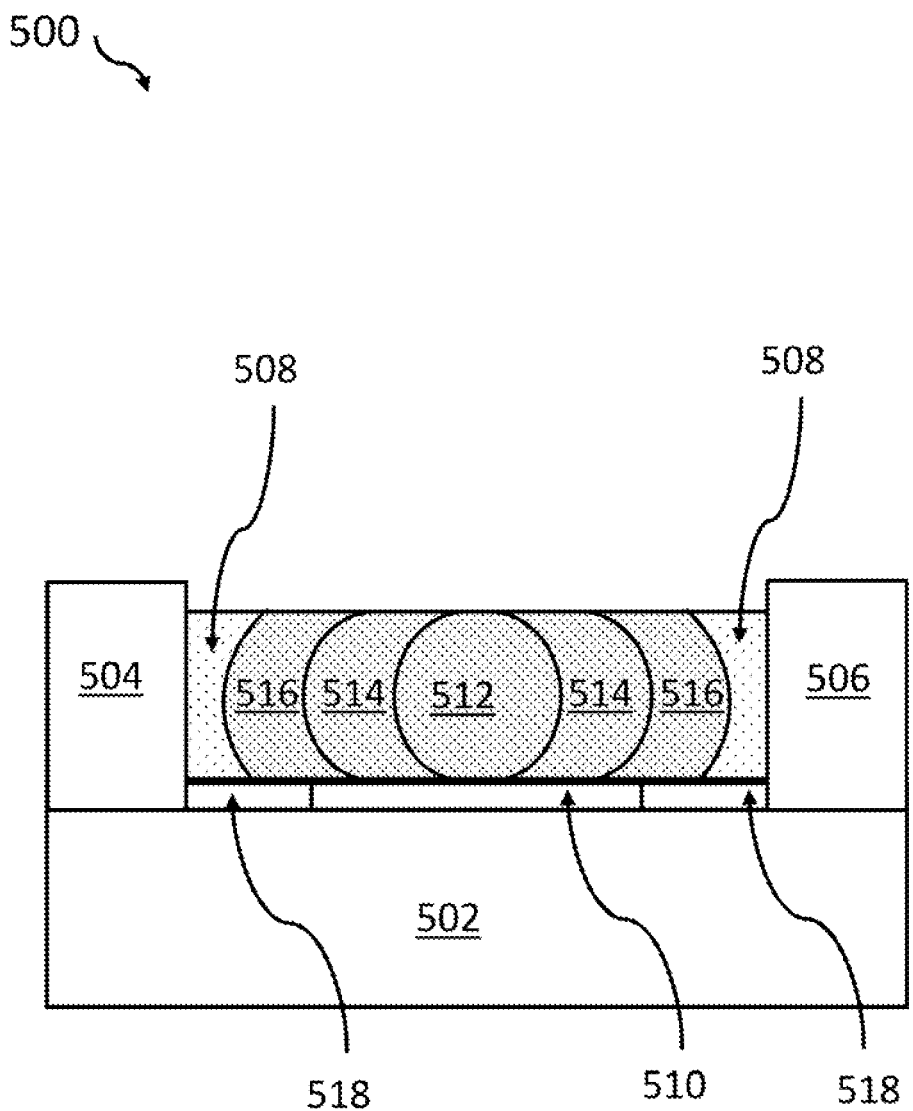
FIG. 5 shows a lateral cell design over a dielectric layer.

In addition to the mushroom type device design of FIG. 1, FIG. 5 shows a lateral cell design 500 over a dielectric layer 502. Between a first electrode 504 and a second electrode 506, a phase-change material 508 in the crystalline phase is positioned. Below the amorphous phase-change material 512, 514, 516 a patterned projection, liner 510 is shown. The areas 518 (i.e., the non-projecting layer portions) outside the projection layer portion 510 in the same layer have a much higher resistance (i.e., much lower conductance) than the centered projection 510.

The amorphous phase of the phase-change material is shown with different diameters 512, 514, 516 indicating different statuses of the phase-change memory cell. The exemplary shown two statuses indicated by the volumes 512 and 514 of the phase-change memory do not cover completely the projection layer portion 510. However, if the amorphous volume 516 of the phase-change memory covers an area larger than the projection layer portion 510, the reset status ($G_{MIN}$) is reached. This is because the current from the first electrode 504 to the second electrode 506 has to flow mainly through the amorphous phase-change material.

Figure 6:
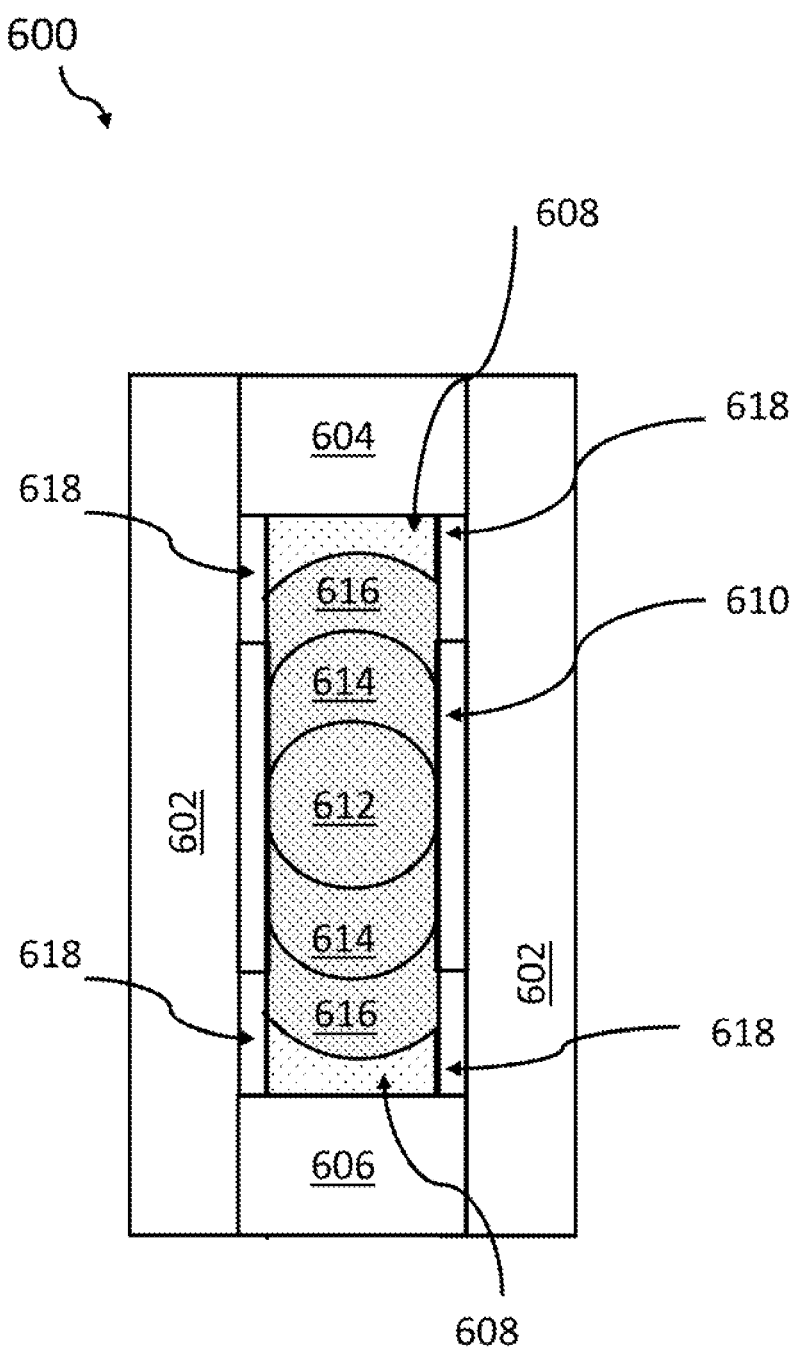
FIG. 6 shows, as another embodiment, a confined design of a phase-change memory cell.

FIG. 6 shows a confined design of a phase-change memory cell or device based on the here proposed concept. Here, the phase-change material 608 in crystalline form is positioned between the top electrode 604 and the bottom electrode 606. The complete device is surrounded by a dielectric layer 602. Also visible is the projection layer portion 610 surrounding a middle portion of the phase-change material 608. Also shown are different volumes 612, 614, 616 of the amorphous phase of the phase-change material of the memory cell. In case the amorphous portion 616 of the phase-change memory material grows larger than the area covered by the projection layer portion 610, the device 600 is in the reset status, i.e., $G_{MIN}$ is reached. It shall also be mentioned that the areas 618 (i.e., the non-projecting layer portions) have a much higher resistivity than the projection layer portion 610.

Hence, in the lateral (FIG. 5) and confined cell design (FIG. 6) the length of the projection layer portion 510, 610 respectively, is limited to be smaller than the longest amorphous length that can be created in the device upon reset. In comparison to this, in a mushroom cell (compare FIG. 1) the projection area 104 is confined to an area that is fully covered by the amorphous half-sphere created in the device upon reset.

Figure 7A:
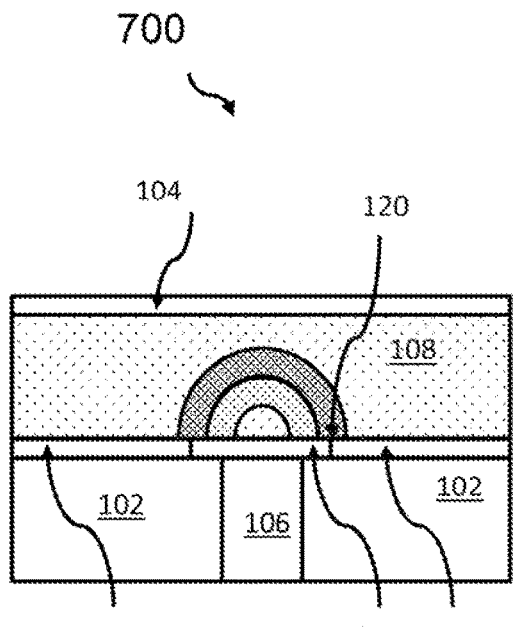
FIGS. 7A and 7B shows a side-by-side comparison of a locally delimited projection layer portion and a projection layer having a dopant gradient.
Figure 7B:
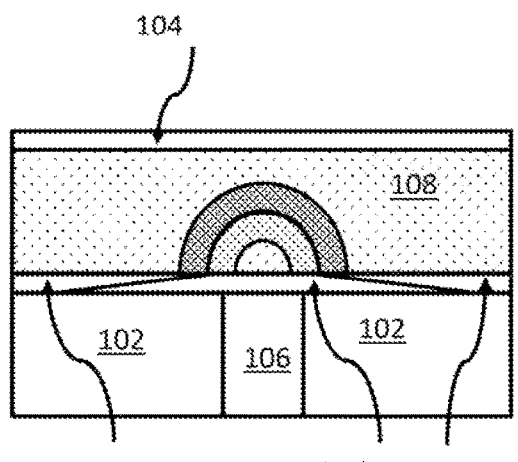
Figure 7C:
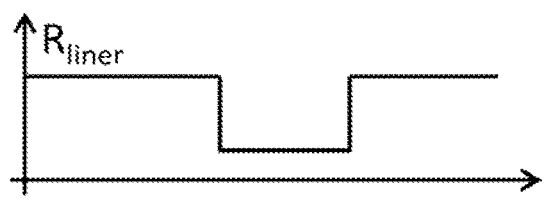
FIGS. 7C and 7D shows the resistance of the liner relating to FIGS. 7A and 7B.

Additionally, it is also possible to use a gradual liner layer with the core projection portion in the middle of the liner. This can be made to make the transition between an uncovered liner portion and a completely covered liner less abrupt. For this, a liner 704 with a doping concentration gradient can be used. The liner 704 becomes more resistive from the center of the amorphous volume to the respective edges. This is shown in FIGS. 7A and 7B in a side-by-side comparison 700 of the cell version discussed in the context of FIG. 1 and a gradient liner version on the right side of the FIG. 7. Hence, FIG. 7A repeats the mushroom cell design from FIG. 1, whereas FIG. 7B relates to a doping concentration gradient of the liner 710.

It may be noted that the reference numerals are widely those used in FIG. 1 and that the left mushroom cell design has a clear vertical line 120 between the projection layer portion 110 of the liner and the remaining portions 118 (non-projecting portion) of the projection layer. The comparable cell design on the right side of FIG. 7B shows a rising and falling edge between a central portion of the projection portion 710 (i.e., liner) and the remaining portions 118 (non-projecting portion).

Figure 7D:
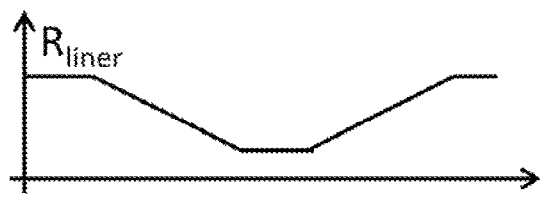
Figure 7E:
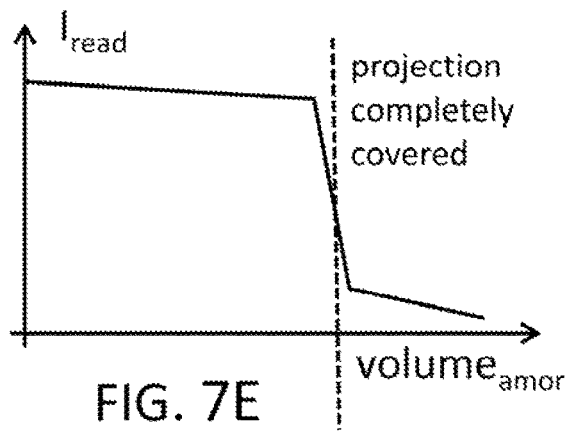
FIGS. 7E and 7F shows a different characteristic of the read current relating to FIGS. 7A and 7B.
Figure 7F:
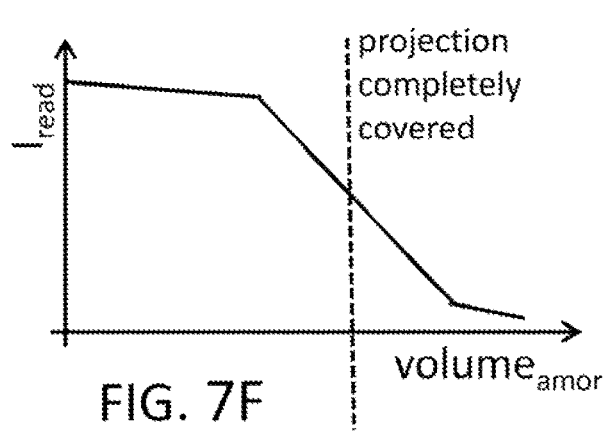

Consequently, the resistance of the liner relating to the left side design (FIG. 7C) shows an abrupt decrease and increase of the resistance, whereas the right side design shows a gradually decreasing and increasing resistance of the liner portion (FIG. 7D). This translates also to a different characteristic of the read current $I_{READ}$. For the left side design (FIG. 7E), the decrease in the read current is abrupt depending on the volume of the amorphous portion of the phase-change material (volume$_{ARMOR}$). In contrast, for the right side (FIG. 7F) design of the memory cell, the degradation of the read current shows a much smoother (smaller inclination) characteristic with a growing volume of the amorphous phase of the phase-change material.

The descriptions of the various embodiments of the present invention have been presented for purposes of illustration but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied together with a system, a related method for use of the memory device, and/or for a computer program product. The computer program product may include a computer readable storage medium (or media) having computer readable program instructions thereon for causing a processor to carry out aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

Based on the foregoing, a computer system, method, and computer program product have been disclosed. However, numerous modifications and substitutions can be made without deviating from the scope of the present invention. Therefore, the present invention has been disclosed by way of example and not limitation.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A memory device enabling a reduced minimal conductance state, said device comprising:
   a first electrode, a second electrode and phase-change material between the first electrode and the second electrode;
   a projection layer located between the phase-change material and the first electrode, wherein the projection layer is located adjacent to the phase-change material in an amorphous phase in a reset state of the memory device, wherein a contact surface of the amorphous phase of the phase-change material is in direct contact with a contact surface of the projection layer, wherein an area of the contact surface of the projection layer is less than an area of the contact surface of the amorphous phase of the phase-change material;

a non-projection layer located adjacent to the projection layer, wherein a contact surface of the non-projection layer is in contact with the contact surface of the amorphous phase of the phase-change material and the contact surface of the non-projection layer is in contact with a contact surface of the phase-change material in a crystalline phase in a reset state of the memory device, wherein a contact surface of the non-projection layer is flush with the contact surface of the projection layer;

a dielectric layer located adjacent to the first electrode, the projection layer, and the non-projection layer, wherein a top surface of the dielectric layer is in contact with a bottom surface of the projection layer, and the non-projection layer, wherein a side surface of the dielectric layer is in contact with a side surface of the first electrode, wherein a top surface of the first electrode is smaller than the bottom surface of the projection layer.

2. The memory device according to claim 1, wherein the projection layer portion comprises $Ti_xN_y$, $Ta_xN_y$ or amorphous carbon.

3. The memory device according to claim 1, wherein the non-projection layer has a conductivity that is lower than a conductivity of the projection layer.

4. The memory device according to claim 3, wherein:
$R_{NON-PROJECTING} \gg R_{AMORPHOUS} \gg R_{PROJECTION}$;
wherein:
$R_{NON-PROJECTING}$=a resistance of the non-projecting layer;
$R_{AMORPHOUS}$=a resistance of the phase-change material if an area covered by the crystalline phase of the phase-change material is covering said projection layer and the non-projection layer; and
$R_{PROJECTION}$=is a resistance of said projection layer portion.

5. The memory device according to claim 3, wherein the projection layer portion and the non-projecting layer portion are differently doped.

6. The memory device according to claim 5, wherein the doping of the non-projecting layer portion and the projection layer portion is such that a device current, when the phase-change material in the amorphous phase covers the complete projection layer portion, is lower by at least a factor of 2 if compared to a status in which the projection layer portion is covered by the phase-change material in the amorphous phase.

7. The memory device according to claim 5, wherein the doping between the projection layer portion and the non-projecting layer of said projection layer changes according to a predefined gradient.

8. The memory device according to claim 7, wherein the projection layer and/or the non-projecting layer is hydrogen or nitrogen doped.

9. The memory device according to claim 8, wherein a dopant concentration increasing the conductivity is higher in the projection layer when compared to the non-projecting layer.

10. The memory device according to claim 8, wherein a dopant concentration decreasing the conductivity is higher in the non-projecting layer when compared to the projection layer.

11. The memory device according to claim 1, wherein:
$R_{CRYST} \ll R_{PROJECTION}$ during a read operation to the memory device, wherein $R_{CRYST}$ is the resistance of said phase-change material in the crystalline phase, and $R_{PROJECTION}$ is the resistance of said projection layer.

12. The memory device according to claim 1, wherein $R_{AMORPHOUS} \gg R_{PROJECTION}$.

* * * * *